United States Patent
Hu

(10) Patent No.: US 10,224,300 B2
(45) Date of Patent: Mar. 5, 2019

(54) PAD STRUCTURE AND MANUFACTURING METHOD THEREOF

(71) Applicant: Dyi-Chung Hu, Hsinchu (TW)

(72) Inventor: Dyi-Chung Hu, Hsinchu (TW)

(*) Notice: Subject to any disclaimer, the term of this patent is extended or adjusted under 35 U.S.C. 154(b) by 0 days.

(21) Appl. No.: 15/667,610

(22) Filed: Aug. 2, 2017

(65) Prior Publication Data

US 2018/0040577 A1 Feb. 8, 2018

Related U.S. Application Data

(60) Provisional application No. 62/370,835, filed on Aug. 4, 2016.

(51) Int. Cl.
*H01L 23/00* (2006.01)
*H01L 23/498* (2006.01)

(52) U.S. Cl.
CPC ............ *H01L 24/06* (2013.01); *H01L 23/498* (2013.01); *H01L 24/03* (2013.01); *H01L 24/05* (2013.01); *H01L 24/13* (2013.01); *H01L 24/16* (2013.01); *H01L 24/81* (2013.01); *H01L 2224/0345* (2013.01); *H01L 2224/0361* (2013.01); *H01L 2224/03462* (2013.01); *H01L 2224/03602* (2013.01); *H01L 2224/0401* (2013.01); *H01L 2224/0558* (2013.01); *H01L 2224/05124* (2013.01); *H01L 2224/05147* (2013.01); *H01L 2224/05571* (2013.01); *H01L 2224/05644* (2013.01); *H01L 2224/05655* (2013.01); *H01L 2224/0603* (2013.01); *H01L 2224/06102* (2013.01); *H01L 2224/131* (2013.01); *H01L 2224/13082* (2013.01); *H01L 2224/16111* (2013.01); *H01L 2224/16237* (2013.01); *H01L 2224/81191* (2013.01); *H01L 2224/81815* (2013.01)

(58) Field of Classification Search
CPC ......... H01L 24/06; H01L 24/05; H01L 24/13; H01L 24/16; H01L 23/498
USPC ....................................... 174/257
See application file for complete search history.

(56) References Cited

U.S. PATENT DOCUMENTS

2014/0117535 A1* 5/2014 Daubenspeck ..... H01L 23/3114
257/737

* cited by examiner

*Primary Examiner* — Tremesha S Willis
(74) *Attorney, Agent, or Firm* — JCIPRNET

(57) ABSTRACT

A pad structure adapted to be disposed on a first package substrate and electrically connected to conductive contacts of a second package substrate includes a first conductive pad having a first top surface, a second conductive pad, a first leveling conductor and a second leveling conductor. The second conductive pad disposed aside the first conductive pad has a second top surface non-coplanar with the first top surface. The first leveling conductor disposed on the first conductive pad has a first leveling surface opposite to the first top surface. The second leveling conductor disposed on the second conductive pad and having a second leveling surface opposite to the second top surface is coplanar with the first leveling surface. The conductive contacts of the second package substrate are disposed on the first leveling conductor and the second leveling conductor. A manufacturing method of a pad structure is also provided.

16 Claims, 13 Drawing Sheets

PAD STRUCTURE AND MANUFACTURING METHOD THEREOF

CROSS REFERENCE TO RELATED APPLICATION

This application claims the priority benefit of U.S. provisional application Ser. No. 62/370,835, filed on Aug. 4, 2016. The entirety of the above-mentioned patent application is hereby incorporated by reference herein and made a part of specification.

BACKGROUND OF THE INVENTION

1. Field of the Invention

The present invention relates to a pad structure, especially relates to a plurality of conductive pads configured on a package substrate with leveling metals for leveling top surfaces of the conductive pads.

2. Description of Related Art

Conventionally, a package substrate includes a plurality of metal pads and a semiconductor chip having metal pins electrically connected to the metal pads through solder joints. In some condition, the top surface of each of the metal pads facing towards the solder joints might be non-coplanar. Such non-coplanar configuration for the metal pads may occur mainly caused by fabrication process due to coefficient of thermal expansions (CTE) mismatch among materials being processed. However, such non-coplanar configuration for the metal pads results in the solder joints failure. Solder joint reliability is seriously affected by even several um's wrinkles on a top surface of a circuitry for a high density thin film package substrate especially, for example, when a high density thin film circuitry has metal pads configured with pitches ranging from around 40 um down to 2 um. As such, improving the reliability of solder joints has become a challenge to researchers in the field.

SUMMARY OF THE INVENTION

The invention provides a pad structure and a manufacturing method thereof, which improving the reliability of electrical connection formed on the pad structure.

The invention provides a pad structure adapted to be disposed on a first package substrate and electrically connected to a plurality of conductive contacts of a second package substrate. The pad structure includes a first conductive pad, a second conductive pad, a first leveling conductor and a second leveling conductor. The first conductive pad has a first top surface. The second conductive pad is disposed aside the first conductive pad and has a second top surface. The second top surface is non-coplanar with the first top surface of the first conductive pad. The first leveling conductor is disposed on the first conductive pad and has a first leveling surface opposite to the first top surface of the first conductive pad. The second leveling conductor is disposed on the second conductive pad and has a second leveling surface opposite to the second top surface of the second conductive pad. The second leveling surface is coplanar with the first leveling surface of the first leveling conductor. The conductive contacts of the second package substrate are disposed on the first leveling conductor and the second leveling conductor.

The invention provides a manufacturing method of a pad structure adapted to be disposed on a first package substrate and electrically connected to conductive contacts of a second package substrate. The method includes the following steps. A first conductive pad and a second conductive pad are provided. The first conductive pad has a first top surface. The second conductive pad disposed aside the first conductive pad has a second top surface. The second top surface is non-coplanar with the first top surface of the first conductive pad. A first leveling conductor is formed on the first top surface of the first conductive pad and a second leveling conductor is formed on the second top surface of the second conductive pad. The first leveling conductor has a first leveling surface opposite to the first top surface of the first conductive pad. The second leveling conductor has a second leveling surface opposite to the second top surface of the second conductive pad. The second leveling surface is coplanar with the first leveling surface. The conductive contacts of the second package substrate are disposed on the first leveling conductor and the second leveling conductor.

Based on the above, the first top surface of the first conductive pad is not aligned with the second top surface of the second conductive pad. Using the first leveling conductor formed on the first top surface of the first conductive pad and the second leveling conductor formed on the second top surface of the second conductive pad, the second leveling surface of the second leveling conductor is coplanar with the first leveling surface of the first leveling conductor. As such, the second package substrate having the conductive contacts may be mounted to the first leveling conductor and the second leveling conductor with improved reliability.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
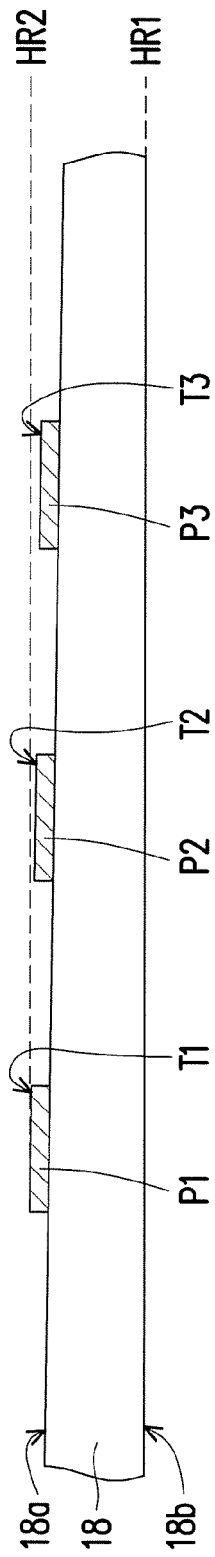
FIG. 1A to FIG. 1G are schematic cross-sectional views illustrating a manufacturing method of a pad structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1G are schematic cross-sectional views illustrating a manufacturing method of an electronic package according to an embodiment of the invention. Referring to FIG. 1A, a first conductive pad P1 and a second conductive pad P2 are provided. The first conductive pad P1 has a first top surface T1. The second conductive pad P2 is disposed aside the first conductive pad P1 and has a second top surface T2. In some embodiments, the first conductive pad P1 and the second conductive pad P2 are adapted to be disposed on a top surface 18a of a first package substrate 18 and electrically connected to the first package substrate 18. For example, the first package substrate 18 may be a thin film high density package substrate, an electrical component, a semiconductor chip or other suitable electrical devices, which is not limited thereto. In some embodiments, more than two conductive pads may be adapted to be disposed on a top surface 18a of a first package substrate 18. As shown in FIG. 1A, a third conductive pad P3 having a third top surface T3 may be disposed aside the second conductive pad P2 and on the top surface 18a of the first package substrate 18. In other word, the second conductive pad P2 may be disposed between the first conductive pad P1 and the third conductive pad P3. It should be noted that the number of the conductive pads in FIG. 1A merely serves as an exemplary illustration and the disclosure is not limited thereto.

In some embodiments, the top surface 18a of the first package substrate 18 may not be leveled due to the thermal stress or warpage caused by thermal expansion mismatch. As shown in FIG. 1A, a first horizontal reference HR1 is configured on a bottom surface 18b of the package substrate 18 opposite to the top surface 18a as a reference to show that the bottom surface of the package substrate 18 is configured horizontally. A second horizontal reference HR2 parallel to the first horizontal reference HR1 is configured on a first top surface T1 of the first conductive pad P1 as a reference to show that at least two of the top surfaces (the first top surface T1, the second top surface T2 and the third top surface T3) are non-coplanar configured. In other word, the first conductive pad P1, the second conductive pad P2 and the third conductive pad P3 are disposed on the surface 18a of the first package substrate 18, and the second top surface T2 of the second conductive pad P2 and the third top surface T3 of the third conductive pad P3 may be non-coplanar with the first top surface T1 of the first conductive pad P1.

Figure 1B:
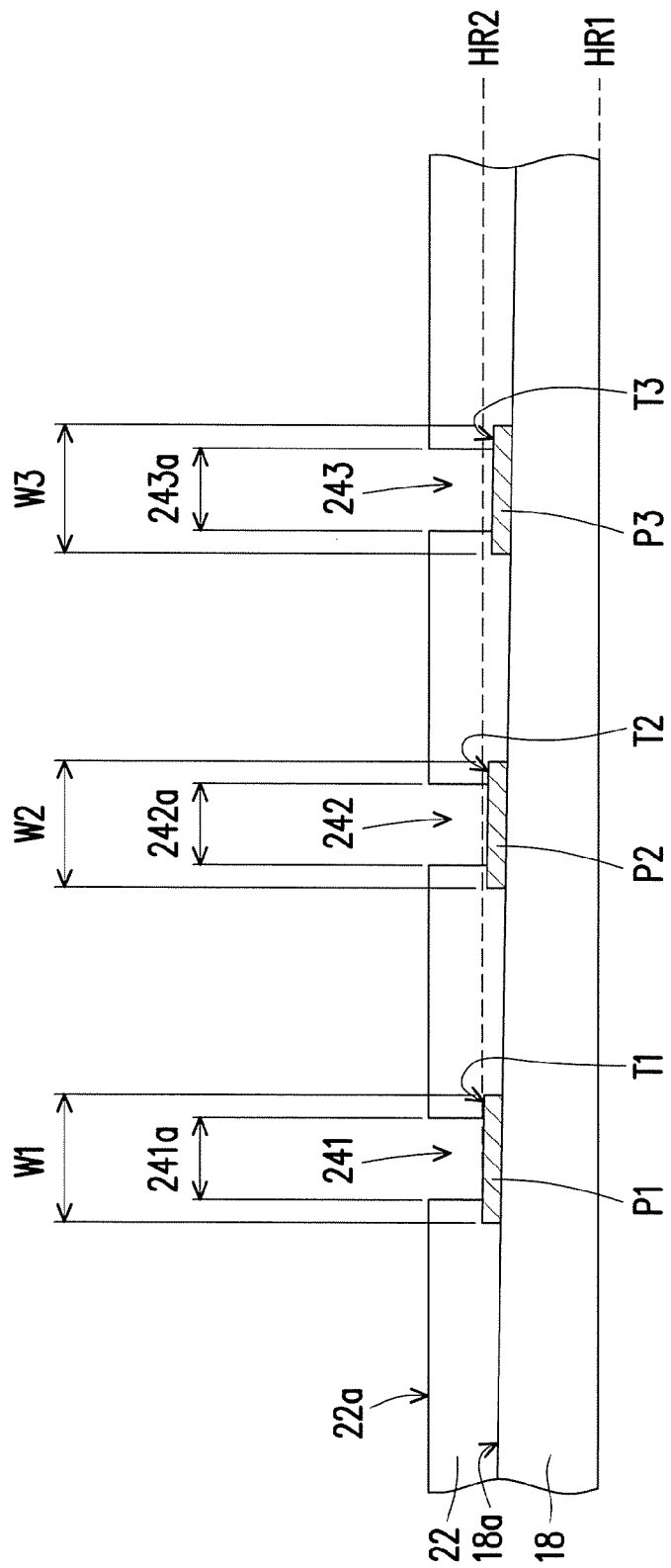

Referring to FIG. 1B, a dielectric layer 22 may be formed on the top surface 18a of the first package substrate 18 and at least a portion of the first conductive pad P1, the second conductive pad P2 and the third conductive pad P3 are exposed by the dielectric layer 22 for further electrical connection. For example, a dielectric material may be formed over the first package substrate 18 to cover the first conductive pad P1, the second conductive pad P2 and the third conductive pad P3. The dielectric material may include solder resist materials such as polymer or other types of solder mask materials, which is not limited thereto. Subsequently, portions of the dielectric material are removed to form the dielectric layer 22 having a plurality of openings (e.g. a first opening 241, a second opening 242, a third opening 243). For example, the first opening 241, the second opening 242 and the third opening 243 of the dielectric layer 22 may correspondingly expose at least a portion of the first top surface T1 of the first conductive pad P1, at least a portion of the second top surface T2 of the second conductive pad P2 and at least a portion of the third top surface T3 of the third conductive pad P3. In other words, a top width 241a of the first opening 241 of the dielectric layer 22 is smaller than a top width W1 of the first conductive pad P1, a top width 242a of the second opening 242 of the dielectric layer 22 is smaller than a top width W2 of the second conductive pad P2, and a top width 243a of the third opening 243 of the dielectric layer 22 is smaller than a top width W3 of the third conductive pad P3. In some embodiments, an inner sidewall of the first opening 241, an inner sidewall of the second opening 242 and an inner sidewall of the third opening 243 may be perpendicular to the first top surface T1 of the first conductive pad P1, the second top surface T2 of the second conductive pad P2 and the third top surface T3 of the third conductive pad P3, correspondingly.

Figure 1C:
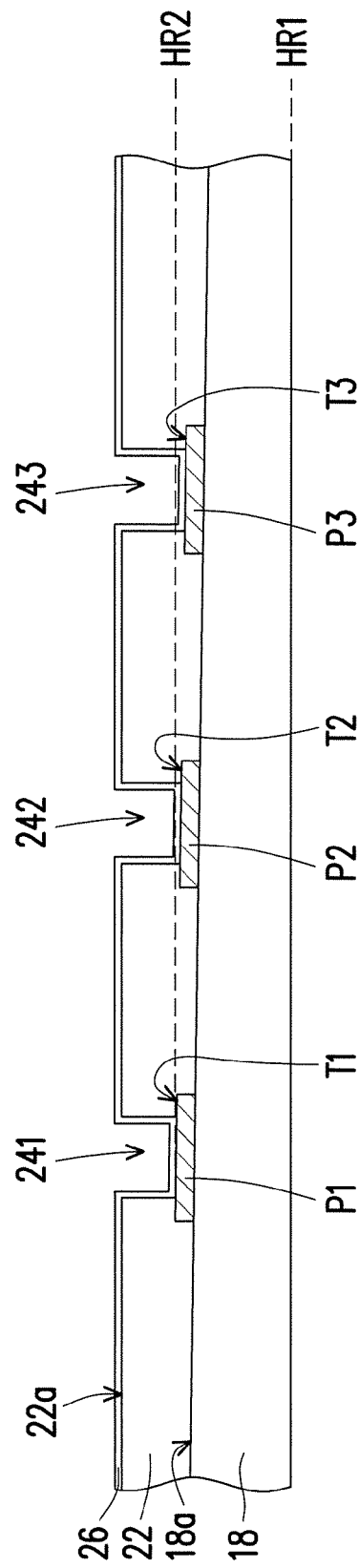

Referring to FIG. 1C, a seed layer 26 is conformally formed over the dielectric layer 22 using a deposition process or other suitable process. For example, the seed layer 26 may be formed on a top surface 22a of the dielectric layer 22 and on the inner sidewalls of the openings (e.g. the first opening 241, the second opening 242 and the third opening 243) of the dielectric layer 22. Portions of the seed layer 26 formed in the openings (e.g. the first opening 241, the second opening 242 and the third opening 243) of the dielectric layer 22 may be coupled to the top surfaces (e.g. the first top surface T1, the second top surface T2 and the third top surface T3) of the conductive pads (e.g. the first conductive pad P1, the second conductive pad P2 and the third conductive pad P3) exposed by the dielectric layer 22. A material of the seed layer 26 may include copper, titanium, gold, nickel, or an alloy thereof, which is not limited thereto. For example, the seed layer 26 can be one of titanium/copper (Ti/Cu) where a layer of titanium is deposited firstly and then a layer of copper is deposited on a top surface of the titanium layer.

Figure 1D:
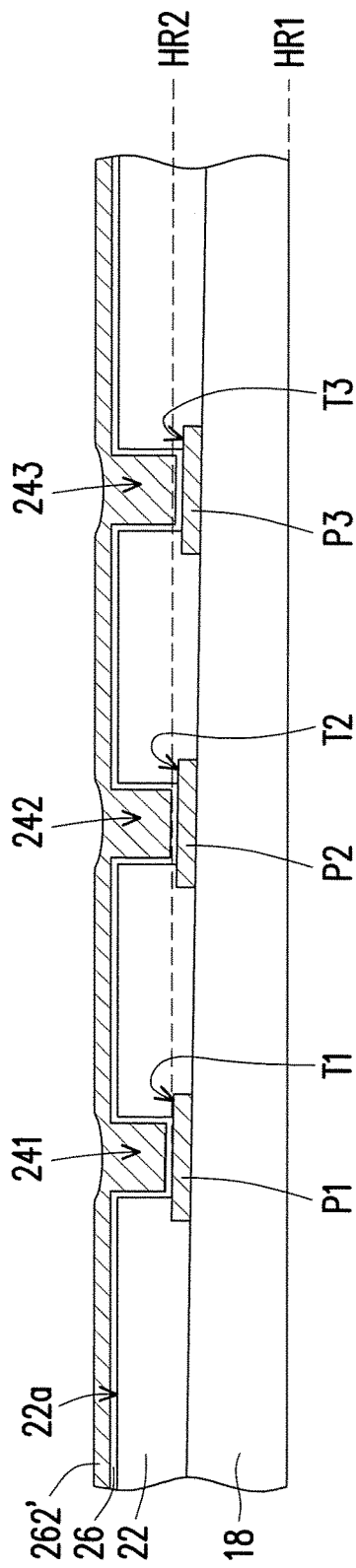
Figure 1E:
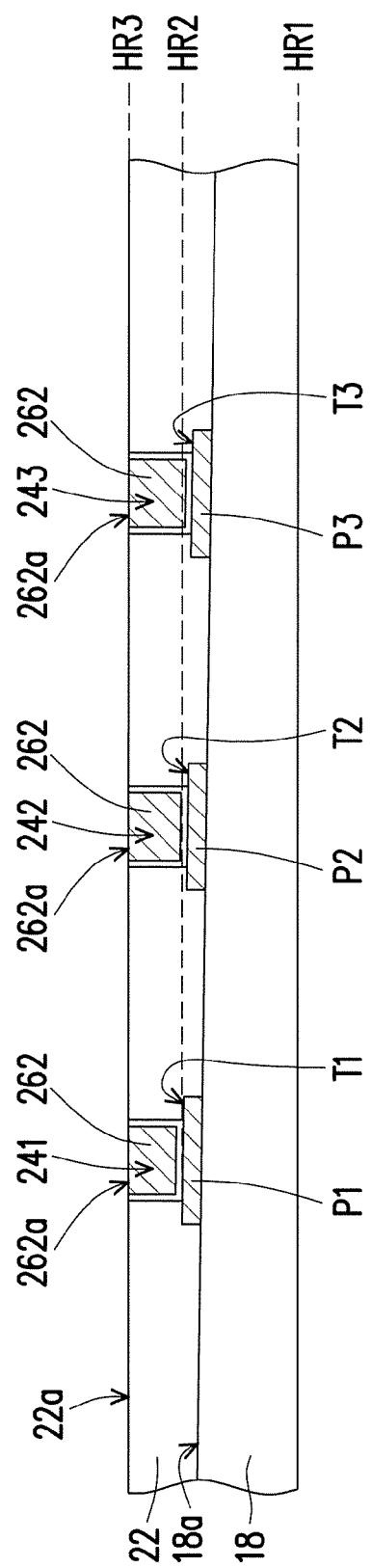

Referring to FIG. 1D and FIG. 1E, after forming the seed layer 26, a conductive material 262' is formed over the seed layer 26 using a sputtering process, an evaporation process, an electroplating process or other suitable process. The conductive material 262' made of material such as copper, aluminium, nickel or other suitable materials. In some embodiments, the conductive material 262' may be formed to cover the top surface 22a of the dielectric layer 22 and fill the first opening 241, the second opening 242 and the third opening 243. Subsequently, a portion of the conductive material 262' formed on the top surface 22a of the dielectric layer 22 outside the first opening 241, the second opening 242 and the third opening 243 of the dielectric layer 22 may be removed to form the conductive layer 262 using, for example, a grinding process, an etching process or other suitable process. In some embodiments, a portion of the seed layer 26 formed on the top surface 22a of the dielectric layer 22 outside the first opening 241, the second opening 242 and the third opening 243 of the dielectric layer 22 may be removed along with the conductive material 262' during the removing process. In some embodiments, after the removing process, a top surface 262a of the conductive layer 262 in each of the first opening 241, the second opening 242 and the third opening 243 of the dielectric layer 22 may be aligned to a third horizontal reference HR3 configured on the top surface 22a of the dielectric layer 22. For example, the third horizontal reference HR3 may be parallel to the first horizontal reference HR1 and the second horizontal reference HR2.

Figure 1F:
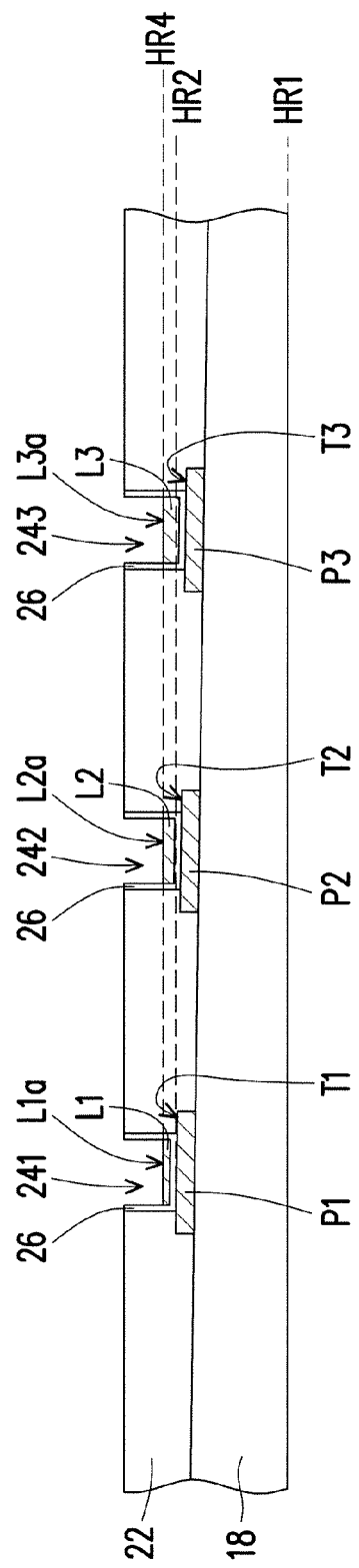

Referring to FIG. 1F, portions of the conductive layer 262 are removed to form a first leveling conductor L in the first opening 241, a second leveling conductor L2 in the second opening 242 and a third leveling conductor L3 in the third opening 243 using, for example, an etching process or other suitable process. After forming the first leveling conductor L1, the second leveling conductor L2 and the third leveling conductor L3, a first leveling surface L1a of the first leveling conductor L1, a second leveling surface L2a of the second leveling conductor L2 and a third leveling surface L3a of the third leveling conductor L3 may be aligned to a fourth horizontal reference HR4. In other words, the first leveling surface L1a of the first leveling conductor L1, the second leveling surface L2a of the second leveling conductor L2 and the third leveling surface L3a of the third leveling conductor L3 may be coplanar after removing portions of the conductive layer 262.

In some embodiments, after removing portions of the conductive layer 262, portions of the seed layer 26 may remain on the inner sidewalls of the openings (e.g. the first opening 241, the second opening 242 and the third opening 243) of the dielectric layer 22. For example, the conductive layer 262 may be made of copper and the seed layer 26 having the titanium layer underlies the copper layer. As a result, after removing portions of the conductive layer 262 (e.g. copper etching), the titanium layer of the seed layer 26 may be left on the surfaces of the inner sidewalls of the openings (e.g. the first opening 241, the second opening 242 and the third opening 243).

Figure 1G:
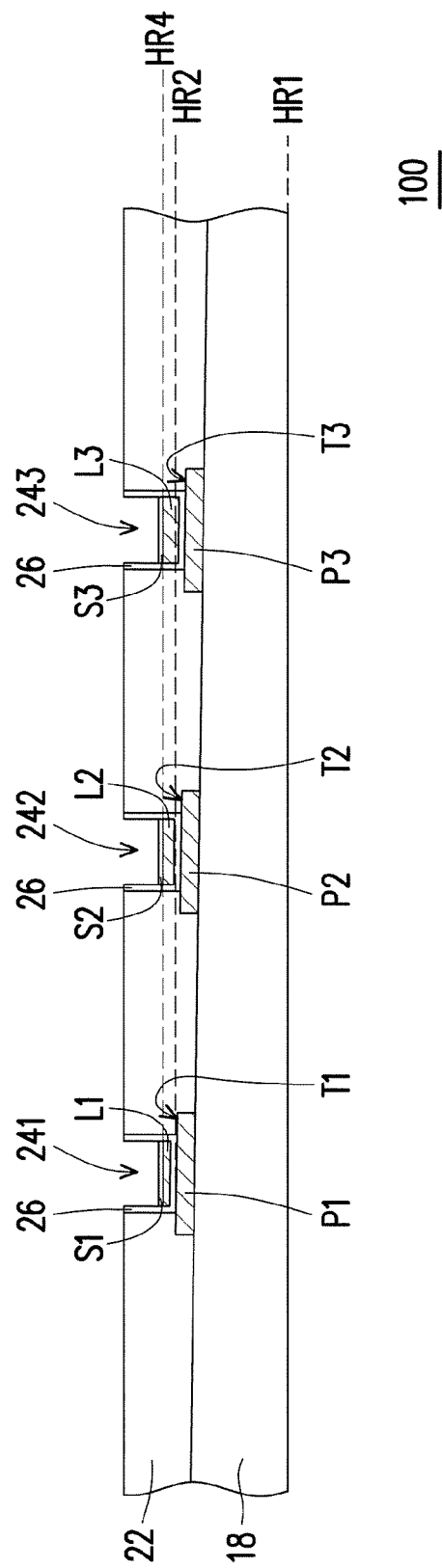

Referring to FIG. 1G, after forming the leveling conductors (e.g. the first leveling conductor L1, the second leveling conductor L2 and the third leveling conductor L3), a first surface finishing conductor S1, a second surface finishing conductor S2 and a third surface finishing conductor S3 are correspondingly formed on the first leveling surface L1a of the first leveling conductor L1, the second leveling surface L2a of the second leveling conductor L2 and the third leveling surface L3a of the third leveling conductor L3. The manufacturing process of a pad structure 100 is substantially completed as shown in FIG. 1G. The first surface finishing conductor S1, the second surface finishing conductor S2 and the third surface finishing conductor S3 can be Electroless Nickel/Immersion Gold (ENIG or Ni/Au), Electroless Nickel/Electroless Palladium/Immersion Gold (ENEPIG or Ni/Pd/Au) or other suitable surface finish material. The details will be described later in other embodiments.

Figure 2A:
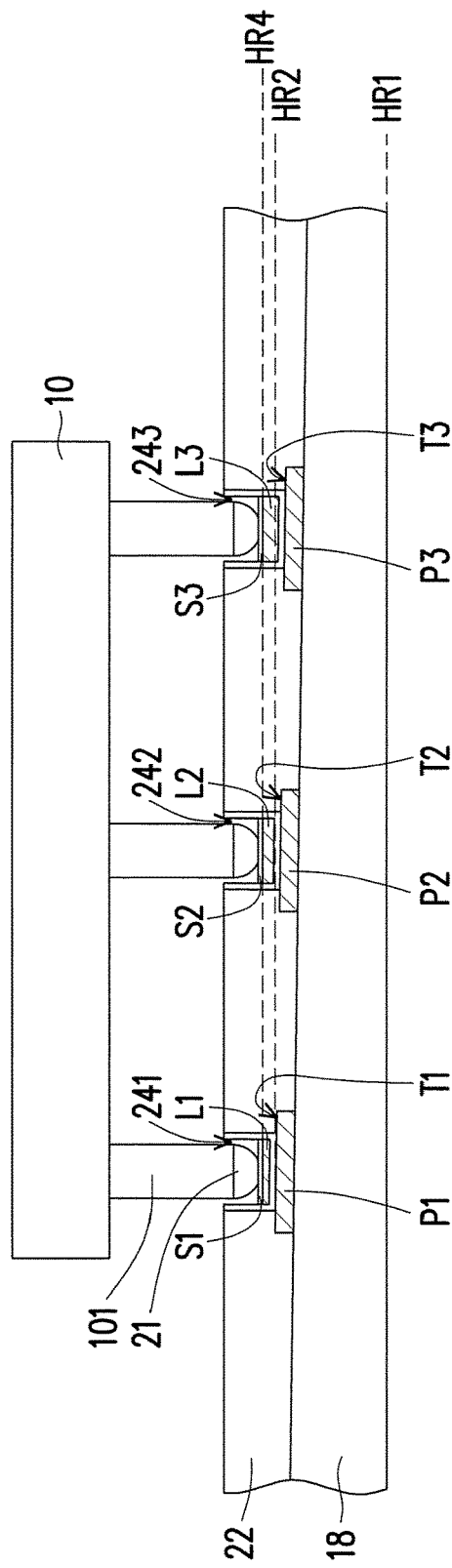
FIG. 2A and FIG. 2B are schematic cross-sectional views illustrating a manufacturing method of a pad structure adapted to be electrically connected to a second package substrate according to an embodiment of the invention.
Figure 2B:
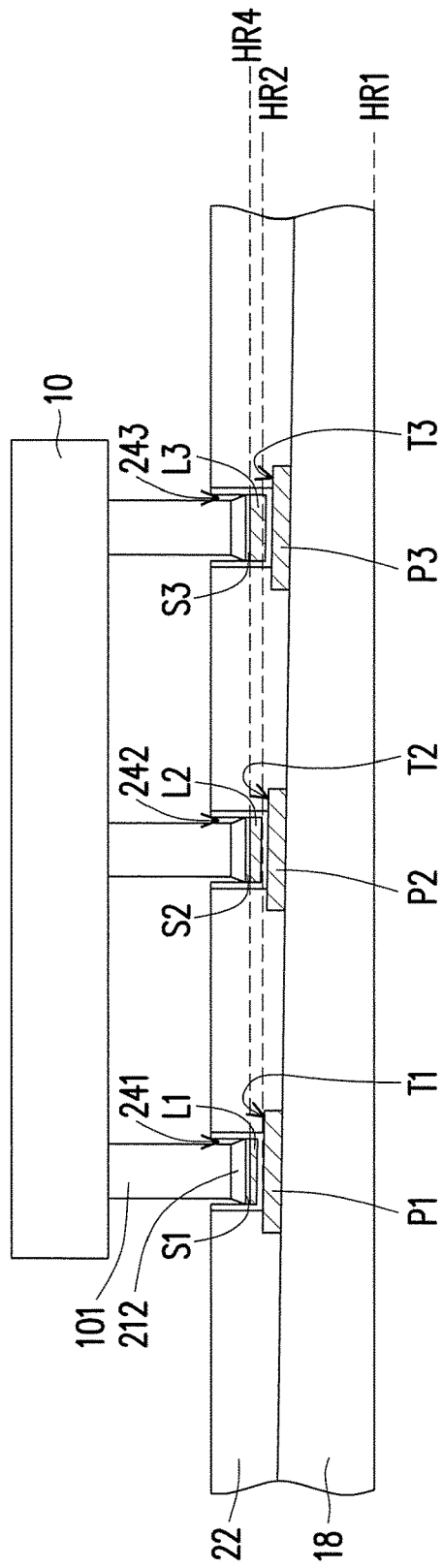

FIG. 2A and FIG. 2B are schematic cross-sectional views illustrating a manufacturing method of the pad structure 100 adapted to be electrically connected to a second package substrate 10 according to an embodiment of the invention. Referring to FIG. 2A, a second package substrate 10 may be disposed on the pad structure 100. In other words, the second package substrate 10 may be electrically connected to the first package substrate 18 through the pad structure 100. In some embodiments, the second package substrate 10 may be a semiconductor chip including a plurality of conductive contacts 101. Other types of electrical component may be utilized as the second package substrate. However, it construes no limitation in the disclosure. For example, the conductive contacts 101 may include conductive pillars, conductive bumps or a combination thereof, which is not limited thereto.

Each of the conductive contacts 101 may be disposed correspondingly in the openings (e.g. the first opening 241, the second opening 242 and the third opening 243) of the dielectric layer 22. Since the inner sidewalls of the first opening 241, the second opening 242 and the third opening 243 are correspondingly perpendicular to the first top surface T1, the second top surface T2 and the third top surface T3, each of the conductive contacts 101 can be confined in the openings (e.g. the first opening 241, the second opening 242 and the third opening 243) of the dielectric layer 22 to enhance reliability. In some other embodiments, solders 21 may be formed in the ends of the conductive contacts 101 facing towards the pad structure 100 when disposing the second package substrate 10. As such, after disposing the second package substrate 10 on the pad structure 100, the conductive contacts 101 may be electrically connected to the pad structure 100 through the solders 21.

Referring to FIG. 2B, a reflowing process may be performed to form the reflowed solders 212 joint the conductive contacts 101 to the surface finishing conductors (e.g. the first surface finishing conductor S1, the second surface finishing conductor S2 and the third surface finishing conductor S3) configured on the top surfaces of the conductive pads (e.g. the first conductive pad P1, the second conductive pad P2 and the third conductive pad P3) respectively. The reflowing process may enhance the adhesion between the second package substrate 10 and the pad structure 100. Since the pad structure 100 has a leveled surface facing towards the conductive contacts 101 of the second package substrate 10, the reliability of electrical connection therebetween is improved.

Figure 3A:
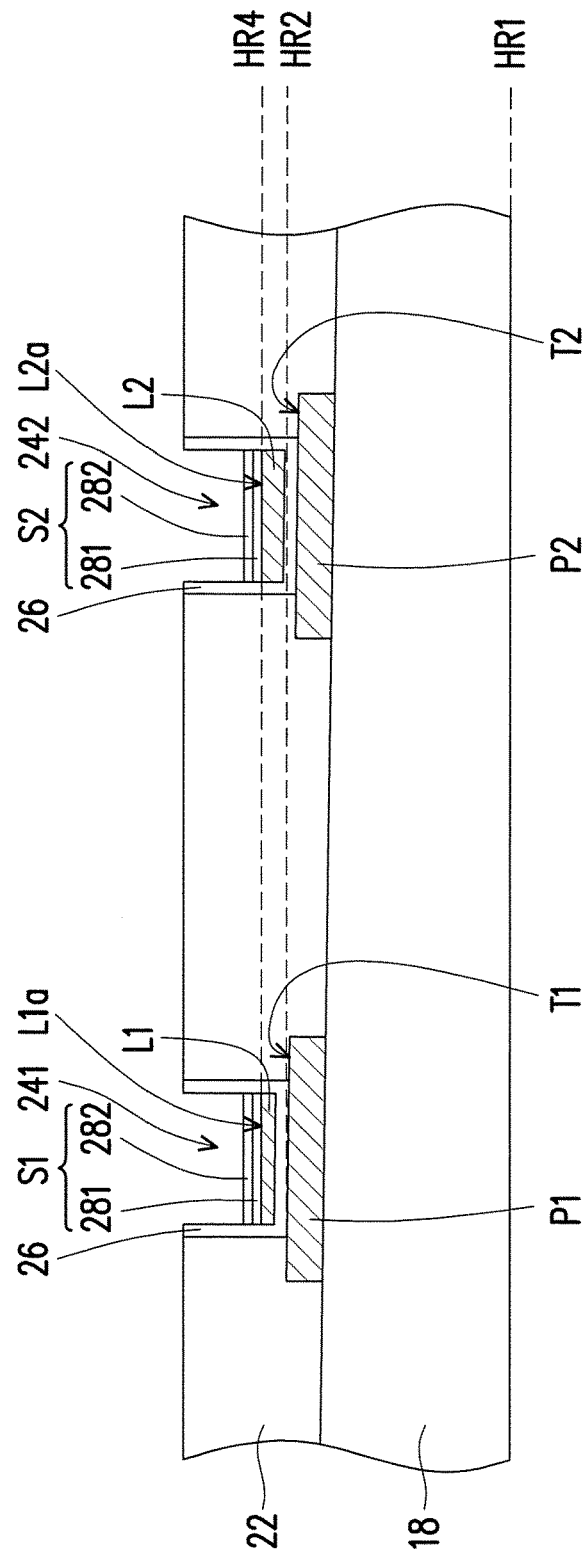
FIG. 3A and FIG. 3B are schematic cross-sectional views illustrating a manufacturing method of a pad structure according to an embodiment of the invention.
Figure 3B:
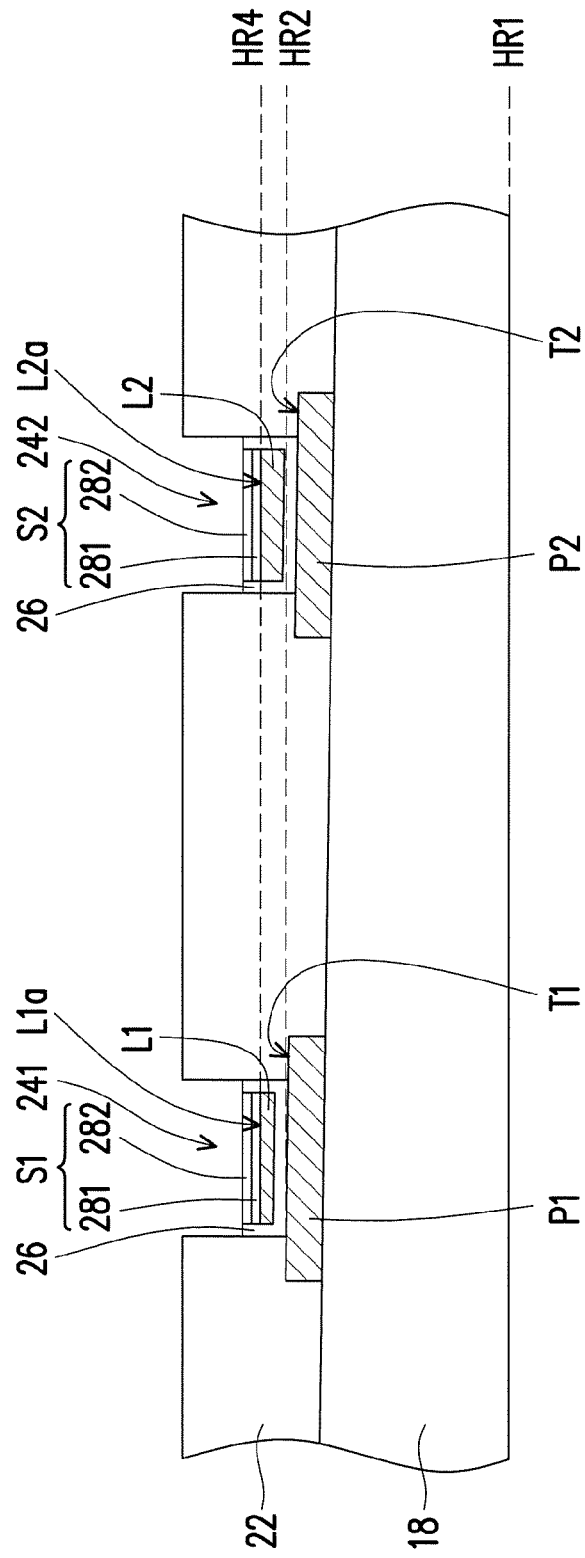

FIG. 3A and FIG. 3B are schematic cross-sectional views illustrating a manufacturing method of a pad structure according to an embodiment of the invention. The pad structure in FIG. 3A is similar with the pad structure in FIG. 1G, but the third conductive pad is omitted in FIG. 3A to enlarge the illustration of the first conductive pad P1 and the second conductive pad P2. It should be noted that the same manufacturing processes may be performed on the third conductive pad shown in FIG. 1G. Referring to FIG. 3A, an electroless nickel/immersion gold (ENIG) surface finishing process is performed to formed the first surface finishing conductor S1 and the second surface finishing conductor S2. For example, each surface finishing conductor (e.g. the first surface finishing conductor S1 and the second surface finishing conductor S2) may include a first metallic layer 281 formed on the leveling conductors (e.g. the first leveling conductor L1 and the second leveling conductor L2) and a second metallic layer 282 formed on the first metallic layer 281.

In some embodiments, during the ENIG surface finishing process, the first metallic layer 281 may be first formed on the top surfaces (e.g. the first leveling surface L1a and the second leveling surface L2a) of the leveling conductors (e.g. the first leveling conductor L1 and the second leveling conductor L2). Subsequently, the second metallic layer 282 may be formed on the first metallic layer 281. In some embodiments, the first metallic layer 281 may be an electroless nickel layer and the second metallic layer 282 may be an immersion gold layer which may provide a good electrical conductivity and surface protection for the pad structure.

Referring to FIG. 3B, portions of the seed layer 26 in the openings exposed by the surface finishing conductors may be removed. As mentioned above in accompany with FIG. 1F, after removing portions of the conductive layer 262 (e.g. copper etching), part of the seed layer 26 (e.g. the titanium layer) may be left on the surfaces of the inner sidewalls of the openings (e.g. the first opening 241, the second opening 242 and the third opening 243). After forming the first surface finishing conductor S1 and the second surface finishing conductor S2, the part of the seed layer 26 exposed by the first surface finishing conductor S1 and the second surface finishing conductor S2 may be removed to expose the parts of inner sidewalls in the openings (e.g. the first opening 241 and the second opening 242) of the dielectric layer 22.

Figure 4A:
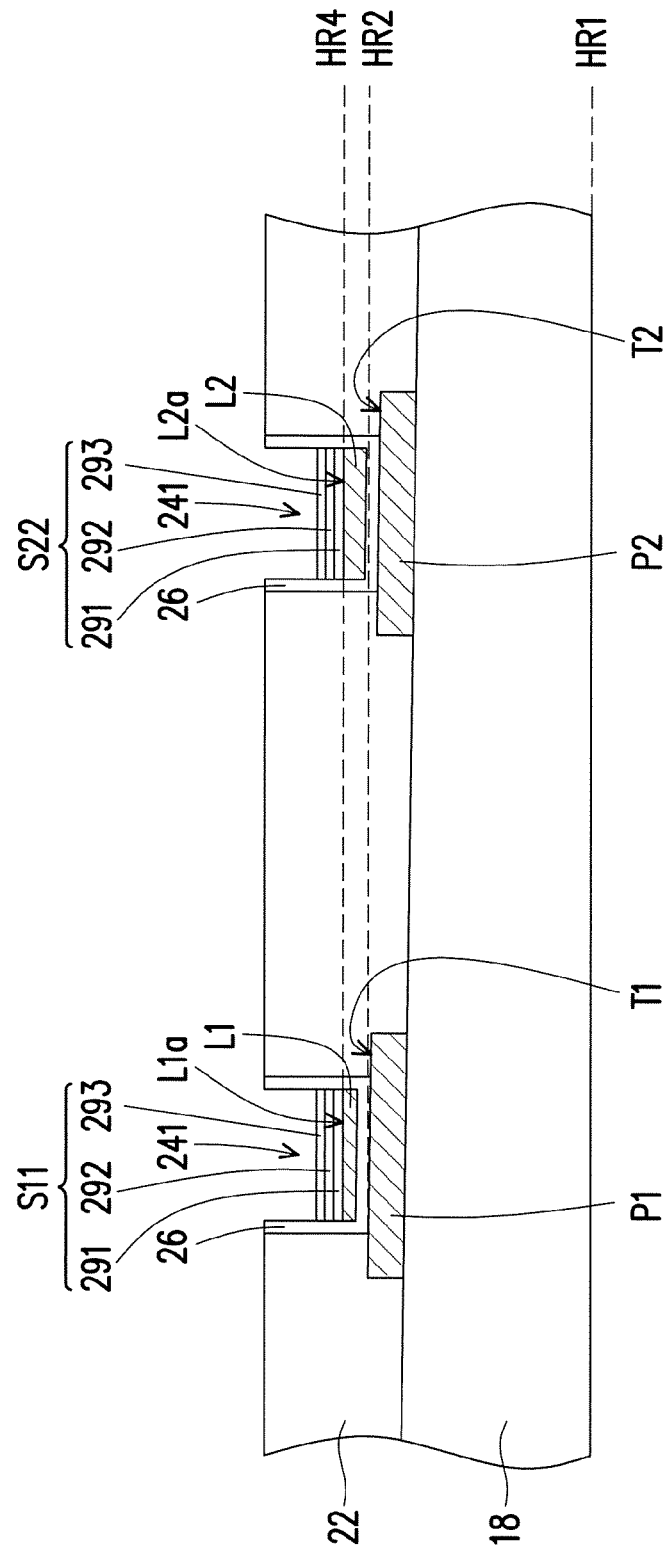
FIG. 4A and FIG. 4B are schematic cross-sectional views illustrating a manufacturing method of a pad structure according to an embodiment of the invention.
Figure 4B:
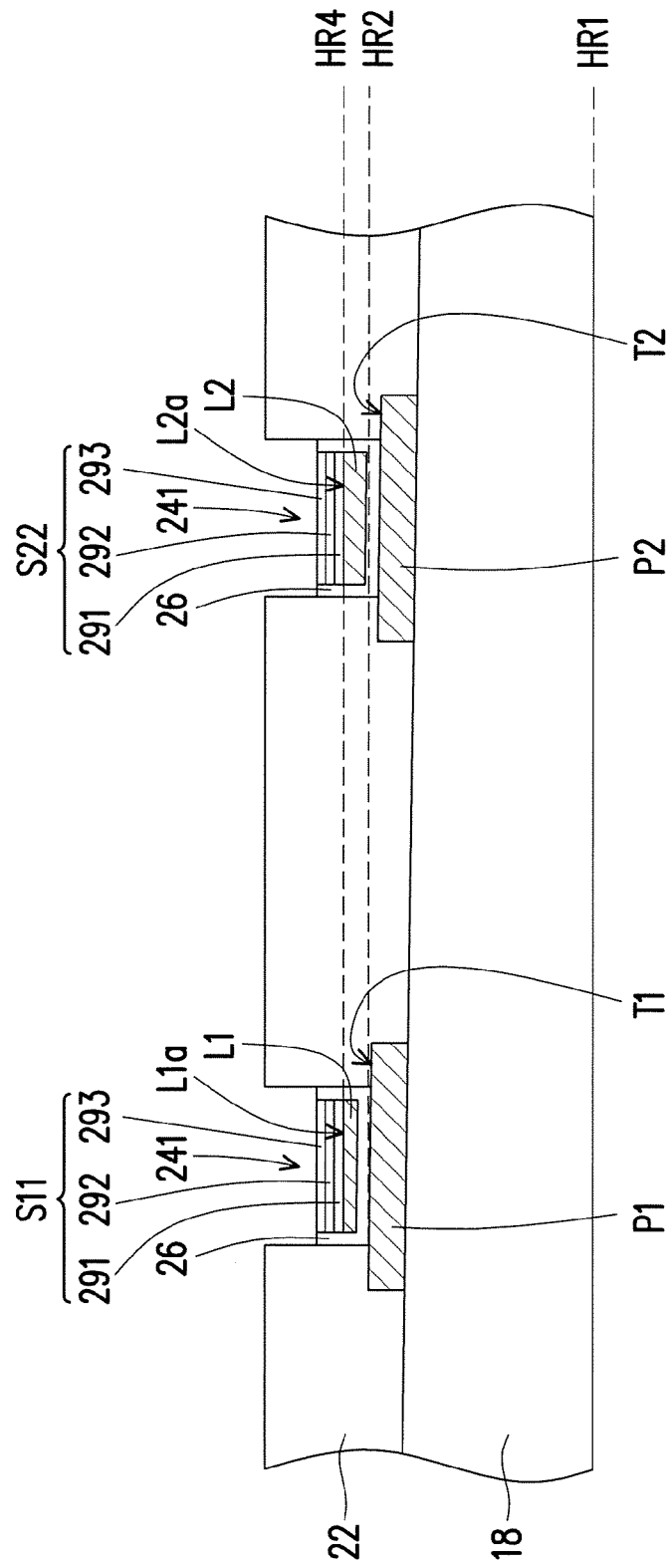

FIG. 4A and FIG. 4B are schematic cross-sectional views illustrating a manufacturing method of a pad structure according to an embodiment of the invention. The manufacturing method of the present embodiment is similar to the embodiment illustrated in FIG. 3A and FIG. 3B. The difference therebetween is, an electroless nickel/electroless palladium/immersion gold (ENEPIG) surface finishing process is performed to formed the first surface finishing conductor S11 and the second surface finishing conductor S22. For example, each surface finishing conductor (e.g. the first surface finishing conductor S11 and the second surface finishing conductor S22) may include a first metallic layer 291 formed on the leveling conductors (e.g. the first leveling conductor L1 and the second leveling conductor L2), a second metallic layer 292 formed on the first metallic layer 291 and a third metallic layer 293 formed on the second metallic layer 292.

In some embodiments, during the ENEPIG surface finishing process, the first metallic layer 291 may be first formed on the top surfaces (e.g. the first leveling surface L1a and the second leveling surface L2a) of the leveling conductors (e.g. the first leveling conductor L1 and the second leveling conductor L2). Next, the second metallic layer 292 may be formed on the first metallic layer 291. Subsequently, the third metallic layer 293 may be formed on the second metallic layer 292. In some embodiments, the first metallic layer 291 may be an electroless nickel layer, the second metallic layer 292 may be an electroless palladium layer and the third metallic layer 293 may be an immersion gold layer. Since the electroless palladium layer is disposed between the electroless nickel layer and the immersion gold layer, the thickness of the immersion gold layer may allow for the reduction, thereby reducing the manufacturing cost.

Referring to FIG. 4B, portions of the seed layer 26 in the openings exposed by the surface finishing conductors may be removed. The removing process is similar with the embodiment illustrated in FIG. 3B and the detailed descriptions are omitted. After removing the portions of the seed layer 26, the parts of inner sidewalls in the openings (e.g. the first opening 241 and the second opening 242) of dielectric layer 22 are exposed.

Based on the above, the first top surface of the first conductive pad is non-coplanar with the second top surface of the second conductive pad. Using the pad structure having the first leveling conductor formed on the first top surface of the first conductive pad and the second leveling conductor formed on the second top surface of the second conductive pad, the second leveling surface of the second leveling conductor is coplanar with the first leveling surface of the first leveling conductor. As such, the second package substrate having the conductive contacts may be mounted to the first leveling conductor and the second leveling conductor with improved reliability. In other words, the pad structure may be utilized onto the connection between any two of electrical components and at least one of the two electrical components may have a non-leveled connecting surface due to thermal expansion mismatch, for example. As such, using the pad structure may solve the problem causing by the non-leveled connecting surface of the electrical components.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A pad structure, adapted to be disposed on a first package substrate and electrically connected to a plurality of conductive contacts of a second package substrate, the pad structure comprising:
   a first conductive pad having a first top surface;
   a second conductive pad disposed aside the first conductive pad and having a second top surface, wherein the second top surface is non-coplanar with the first top surface of the first conductive pad;
   a first leveling conductor disposed on the first conductive pad and having a first leveling surface opposite to the first top surface of the first conductive pad; and
   a second leveling conductor disposed on the second conductive pad and having a second leveling surface opposite to the second top surface of the second conductive pad, wherein the entire second leveling surface is coplanar with the entire first leveling surface of the first leveling conductor, the conductive contacts of the second package substrate are disposed on the first leveling conductor and the second leveling conductor, the first conductive pad is located between the first leveling conductor and the first package substrate, and the second conductive pad is located between the second leveling conductor and the first package substrate.

2. The pad structure according to claim 1, further comprising:
   a first surface finishing conductor disposed on the first leveling surface of the first leveling conductor; and
   a second surface finishing conductor disposed on the second leveling surface of the second leveling conductor.

3. The pad structure according to claim 2, further comprising:
   a dielectric layer covering the first conductive pad and the second conductive pad, wherein the dielectric layer has a first opening exposing at least a portion of the first top surface of the first conductive pad and a second opening exposing at least a portion the second top surface of the second conductive pad.

4. The pad structure according to claim 3, wherein a top width of the first opening of the dielectric layer is smaller than a top width of the first conductive pad, and a top width of the second opening of the dielectric layer is smaller than a top width of the second conductive pad.

5. The pad structure according to claim 3, wherein the first leveling conductor is disposed in the first opening of the dielectric layer, and the second leveling conductor is disposed in the second opening of the dielectric layer.

6. The pad structure according to claim 3, wherein the first surface finishing conductor is disposed in the first opening of dielectric layer, and the second surface finishing conductor is disposed in the second opening of dielectric layer.

7. The pad structure according to claim 3, wherein an inner sidewall of the first opening of the dielectric layer is perpendicular to the first top surface of the first conductive pad, and an inner sidewall of the second opening of the dielectric layer is perpendicular to the second top surface of the second conductive pad.

8. The pad structure according to claim 3, wherein a material of the first surface finishing conductor and a material of the second surface finishing conductor are one of ENIG and ENEPIG.

9. A manufacturing method of a pad structure adapted to be disposed on a first package substrate and electrically connected to conductive contacts of a second package substrate, the manufacturing method comprising:

providing a first conductive pad and a second conductive pad, wherein the first conductive pad has a first top surface, the second conductive pad disposed aside the first conductive pad has a second top surface, and the second top surface is non-coplanar with the first top surface of the first conductive pad; and forming a first leveling conductor on the first top surface of the first conductive pad and a second leveling conductor on the second top surface of the second conductive pad, wherein the first leveling conductor has a first leveling surface opposite to the first top surface of the first conductive pad, the second leveling conductor has a second leveling surface opposite to the second top surface of the second conductive pad, the entire second leveling surface is coplanar with the entire first leveling surface, the conductive contacts of the second package substrate are disposed on the first leveling conductor and the second leveling conductor, the first conductive pad is located between the first leveling conductor and the first package substrate, and the second conductive pad is located between the second leveling conductor and the first package substrate.

10. The manufacturing method according to claim 9, further comprising:

before forming the first leveling conductor and the second leveling conductor, forming a dielectric layer to cover the first conductive pad and the second conductive pad, wherein the dielectric layer exposes at least a portion of the first top surface of the first conductive pad and at least a portion of the second top surface of the second conductive pad.

11. The manufacturing method according to claim 10, wherein forming the dielectric layer comprises:

forming a dielectric material over the first conductive pad and the second conductive pad; and removing a portion of the dielectric material to form a first opening exposing at least a portion of the first top surface of the first conductive pad and a second opening exposing at least a portion of the second top surface of the second conductive pad.

12. The manufacturing method according to claim 11, wherein forming the first leveling conductor and the second leveling conductor comprises:

conformally forming a seed layer on the dielectric layer and in the first opening and the second opening of the dielectric layer, wherein a portion of the seed layer in the first opening and the second opening of the dielectric layer is coupled to the first top surface of the first conductive pad and the second top surface of the second conductive pad exposed by the first opening and the second opening of the dielectric layer.

13. The manufacturing method according to claim 12, wherein forming the first leveling conductor and the second leveling conductor comprises:

after forming the seed layer, forming a conductive material over the seed layer;

removing a portion of the conductive material to form a conductive layer and removing a portion of the seed layer, wherein the portion of the conductive material and the portion of the seed layer formed on the dielectric layer outside the first opening and the second opening of the dielectric layer are removed, a top surface of the conductive layer in each of the first opening and the second opening of the dielectric layer is aligned; and removing a portion of the conductive layer to form the first leveling conductor in the first opening of the dielectric layer and the second leveling conductor in the second opening of the dielectric layer.

14. The manufacturing method according to claim 13, further comprising:

forming a first surface finishing conductor on the first leveling surface of the first leveling conductor and a second surface finishing conductor on the second leveling surface of the second leveling conductor.

15. The manufacturing method according to claim 14, wherein after forming the first surface finishing conductor and the second surface finishing conductor, removing a portion of the seed layer in the first opening and the second opening of the dielectric layer exposed by the first surface finishing conductor and the second surface finishing conductor.

16. The manufacturing method according to claim 14, wherein a material of the first surface finishing conductor and a material of the second surface finishing conductor are one of ENIG and ENEPIG.

* * * * *